(12) United States Patent
Igarashi et al.

(10) Patent No.: US 8,528,947 B2
(45) Date of Patent: *Sep. 10, 2013

(54) CLOSED CONTAINER AND LID OPENING/CLOSING SYSTEM THEREFOR

(75) Inventors: Hiroshi Igarashi, Tokyo (JP); Toshihiko Miyajima, Tokyo (JP); Tsutomu Okabe, Tokyo (JP)

(73) Assignee: TDK Corporation, Tokyo (JP)

( * ) Notice: Subject to any disclaimer, the term of this patent is extended or adjusted under 35 U.S.C. 154(b) by 1007 days.

This patent is subject to a terminal disclaimer.

(21) Appl. No.: 12/491,574

(22) Filed: Jun. 25, 2009

(65) Prior Publication Data

US 2010/0059408 A1 Mar. 11, 2010

Related U.S. Application Data

(60) Provisional application No. 61/095,195, filed on Sep. 8, 2008.

(51) Int. Cl.
*E05C 1/06* (2006.01)
*B65D 85/00* (2006.01)

(52) U.S. Cl.
USPC ............ 292/144; 292/9; 292/23; 292/41; 292/193; 292/DIG. 11; 292/DIG. 25; 414/411; 206/710

(58) Field of Classification Search
USPC .......... 414/217, 217.1, 411, 940; 292/2–4, 292/9, 14–16, 23, 32, 33, 38, 39, 41, 73–77, 292/137, 138, 142, 144, 156, 157, 159, 160, 292/163, 164, 172, 174, 179, 193, 256.5, 292/DIG. 11, DIG. 25, DIG. 55; 70/77–82, 70/158, 163, 164, 275, 277, 278.1, 280; 206/454, 710, 711; 220/315, 324

See application file for complete search history.

(56) References Cited

U.S. PATENT DOCUMENTS 4,063,763 A * 12/1977 van Herpen ............ 292/39
5,118,145 A * 6/1992 Tucker ................. 292/158
(Continued)

FOREIGN PATENT DOCUMENTS

JP 2001-77177 3/2001
JP 3417821 4/2003
(Continued)

OTHER PUBLICATIONS

U.S. Appl. No. 12/615,359, filed Nov. 10, 2009, Okabe, et al.

(Continued)

*Primary Examiner* — Carlos Lugo
*Assistant Examiner* — Alyson M Merlino
(74) *Attorney, Agent, or Firm* — Oblon, Spivak, McClelland, Maier & Neustadt, L.L.P.

(57) ABSTRACT

In a pod used in an FIMS system, diffusion of dust particles or the like adhering on the lid of the pod to the interior of the system is reduced. An engaged portion is provided inside the outer surface of the lid of the pod, and a flange portion provided around a pod opening to which the lid can be fitted is provided with an insertion hole that allows access to the engaged portion from the exterior space. A latch mechanism is supported on the pod body side surface of the flange portion in such a way that the latch mechanism can slide along a direction parallel to the side wall of the flange. An engagement portion of the latch mechanism reaches the engaged portion through the insertion hole, and the state of the latch mechanism changes between an engaged state and a disengaged state with movement of the latch mechanism.

17 Claims, 11 Drawing Sheets

(56) References Cited

U.S. PATENT DOCUMENTS

| | | | |
|---|---|---|---|
| 5,253,903 A * | 10/1993 | Daley | 292/39 |
| 5,481,889 A * | 1/1996 | Richard et al. | 70/118 |
| 5,820,234 A * | 10/1998 | Capwell et al. | 312/216 |
| 6,082,951 A * | 7/2000 | Nering et al. | 414/217.1 |
| 6,086,121 A * | 7/2000 | Buckland | 292/34 |
| 6,105,782 A * | 8/2000 | Fujimori et al. | 206/710 |
| 6,186,331 B1 * | 2/2001 | Kinpara et al. | 206/711 |
| 6,281,516 B1 * | 8/2001 | Bacchi et al. | 250/559.29 |
| 6,390,145 B1 | 5/2002 | Okabe et al. | |
| 6,398,475 B1 * | 6/2002 | Ishikawa | 414/217 |
| 6,430,802 B1 | 8/2002 | Miyajima | |
| 6,457,598 B1 * | 10/2002 | Hsieh et al. | 220/323 |
| 6,622,883 B1 * | 9/2003 | Wu et al. | 220/323 |
| 6,623,051 B2 * | 9/2003 | Bonora | 292/330 |
| 6,641,349 B1 * | 11/2003 | Miyajima et al. | 414/217 |
| 6,681,604 B1 * | 1/2004 | Samsel | 70/78 |
| 6,796,763 B2 * | 9/2004 | Miyajima et al. | 414/805 |
| 6,902,063 B2 * | 6/2005 | Pai et al. | 206/710 |
| 6,984,097 B1 * | 1/2006 | Saeki et al. | 414/411 |
| 7,370,890 B2 * | 5/2008 | Samsel | 292/42 |
| 7,614,840 B2 * | 11/2009 | Okabe et al. | 414/217.1 |
| 2010/0059408 A1 * | 3/2010 | Igarashi et al. | 206/710 |
| 2010/0133270 A1 * | 6/2010 | Okabe et al. | 220/212 |
| 2011/0210041 A1 * | 9/2011 | Okabe et al. | 206/710 |
| 2011/0210042 A1 * | 9/2011 | Okabe et al. | 206/710 |
| 2011/0215028 A1 * | 9/2011 | Igarashi et al. | 206/710 |

FOREIGN PATENT DOCUMENTS

| | | | |
|---|---|---|---|
| JP | 2010087455 A * | 4/2010 | |
| JP | 2010118385 A * | 5/2010 | |
| JP | 2011035419 A * | 2/2011 | |
| JP | 2011151417 A * | 8/2011 | |
| JP | 2011181561 A * | 9/2011 | |
| JP | 2011187615 A * | 9/2011 | |
| JP | 2011187866 A * | 9/2011 | |

OTHER PUBLICATIONS

U.S. Appl. No. 12/624,579, filed Nov. 24, 2009, Okabe, et al.
U.S. Appl. No. 13/035,335, filed Feb. 25, 2011, Okabe, et al.
U.S. Appl. No. 13/035,425, filed Feb. 25, 2011, Okabe, et al.
U.S. Appl. No. 13/041,786, filed Mar. 7, 2011, Igarashi, et al.

* cited by examiner

CLOSED CONTAINER AND LID OPENING/CLOSING SYSTEM THEREFOR

This application claims priority from U.S. Provisional Application No. 61/095,195 filed Sep. 8, 2008, which is hereby incorporated by reference herein.

BACKGROUND OF THE INVENTION

1. Field of the Invention

The present invention relates to what is called a FIMS (Front-Opening Interface Mechanical Standard) system that is used when wafers stored in the interior of a transfer container called a pod between semiconductor processing apparatuses in a semiconductor manufacturing process etc. More specifically, the present invention relates to a pod called a FOUP (Front-Opening Unified Pod) or a closed container for containing wafers and a lid opening/closing system as a FIMS system for opening/closing the lid of the pod to perform transfer of wafers into/out of the pod.

2. Related Background Art

In semiconductor manufacturing processes performed in recent years, only the interior of a processing apparatus, the interior of a pod (storage container for wafers) and a mini-environment through which transfer of substrates or wafers from the pod to the processing apparatus is performed are kept in a highly clean state, and the degree of cleanness of the other spaces is maintained at a certain level. The pod is composed of a substantially cubical body having shelves provided therein that can hold a plurality of wafers in a parallel and separated state and an opening provided on one side thereof through which wafers can be brought into/out of it, and a lid for closing the opening. Those pods which have an opening provided not on the bottom but on one lateral side thereof (i.e. the side to be directly opposed to the mini-environment) are collectively called FOUP.

A structure that defines the above mentioned mini-environment has a opening portion to be opposed to the opening of the pod, a door that closes the opening portion, another processing apparatus side opening portion provided on the semiconductor processing apparatus side of the structure, and a transferring robot that is adapted to reach into the interior of the pod through the opening portion to pick up a wafer and transfer it into the processing apparatus through the other opening portion on the processing apparatus side. The structure that defines the mini-environment further has a support table that supports the pod in such a way that the pod opening is placed just in front of the door. On the top surface of the support table are provided positioning pins to be fitted into positioning holes provided on the bottom surface of the pod to regulate the placement position of the pod and a clamp unit for engaging a clamped portion provided on the bottom surface of the pod to fix the pod to the support table. Typically, the support table is adapted to be movable toward and away from the door over a predetermined distance. When the wafers in a pod are to be transferred into the processing apparatus, the pod placed on the support table is moved until the lid of the pod abuts the door, and then after abutment, the lid is detached from the opening of the pod by the door. By these operations, the interior of the pod and the interior of the processing apparatus are bought into communication with each other through the mini-environment to allow wafer transferring operations that will be performed repeatedly. All of the support table, the door, the opening portion, a mechanism for opening and closing the door and a wall partly defining the mini-environment and having the opening collectively constitute what is called a FIMS system mentioned above.

The lid of a conventional pod is provided, for example, with tongues that are extendable/retractable outwardly beyond/into the outer periphery of the lid so that the pod body and the lid are brought into an engaging state and a disengaged state by extension and retraction of the tongues, as described in detail in Japanese Patent Application Laid-Open No. 2001-077177. Extension and retraction of the tongues are performed by fitting a so-called key member into an operated portion that is linked with the tongues and disposed at a certain position in the central area of the lid, from the outside of the front surface of the lid. Such contact, rotation and sliding etc. of this member generate dust that should be generally taken care of in the semiconductor manufacturing process. However, the dust is brought into the mini-environment in which downward air flow is present before diffused from the small gap between the surface of the lid and the surface of the door to the exterior of the gap. Therefore, the amount of dust diffused into the mini-environment or the pod is not so much that it is regarded as problem, and no countermeasure to such dust has been taken.

The pod is transferred in a space in which the degree of cleanness is relatively low. Therefore, dust adheres to the outer surface of the pod body and to the surface of the lid in that space, and substances, such as for example hydrocarbon, contained in the atmospheric air is adsorbed on these surface. It has been considered that such dust and substances are also favorably removed by the effect of downward air flow as with the above-described dust generated by the key member etc.

Improvement in the performance of semiconductor devices and reduction in the size of semiconductor devices have be progressively made. Accordingly, the width of wiring and design rules etc. used in devices have been narrowed, and it has become necessary to take care of smaller size dust particles that did not matter before. Such very small dust particles move in a space due to Brownian motion or influence of weak electrostatic forces. Such motions of very small dust particles are different from those of the dust particles for which countermeasures have conventionally been taken. More specifically, even if the above described downward air flow is supplied with a view to move such very small dust particles down in the mini-environment and to expels them to the exterior space, there is a possibility that dust particles are not simply moved by the air flow but float into the mini-environment. Japanese Patent No. 3417821 discloses a structure in which swing levers are provided outside the opening of the pod instead of tongues provided on the lid, and the lid is pressed down by the levers from the outer surface side of the lid in the state in which the opening is closed by the lid. In this structure, dust like that generated by the key member in the structure disclosed in Japanese Patent Application Laid-Open No. 2001-077177 is generated in the periphery of the opening, and diffusion of dust from the lid and the door that holds the lid may be reduced as compared to the structure disclosed in Japanese Patent Application Laid-Open No. 2001-077177. However, since it is necessary to operate the levers in advance before the operation of opening/closing the lid, and the structure for this operation is provided in the vicinity of the opening, there is a possibility that very small dust particles existing in the outer space are diffused into the mini-environment.

SUMMARY OF THE INVENTION

The present invention has been made in view of the above described situations, and has as an object to provide a pod or a closed container in which influence of very small dust particles adhering to the surface of a lid that closes the opening of the pod is controlled and generation of dust by the operation of opening/closing the lid upon opening/closing the lid and diffusion of the dust thus generated into a mini-environment and the interior of the pod are controlled, and to provide a lid opening/closing system associated with such a closed container.

To achieve the above object, according to the present invention, there is provided a closed container comprising: a lid having a flat plate-like shape and having an engaged portion provided in the flat plate-like shape; a container body having an interior space in which an object can be stored, an opening that allows communication between the interior space and the external space and is to be closed by one side of the flat plate-like shape of the lid, a flange portion that extends from the periphery of the opening parallel to a surface on which the opening is formed and defines a receiving recess in which the lid is received in a state in which the opening is closed by the lid and an insertion hole that passes from an outer surface of the flange portion to the receiving recess and is provided at a position aligned with the engaged portion in a state in which the lid is received in the receiving recess; and a latch mechanism having a latch main body that is movable along an axis parallel to the surface on which the opening is formed and extends in the direction of the axis, a link portion that projects from the latch main body in a direction different from a direction along the axis and an engagement portion disposed at an end of the link portion, wherein at least the engagement portion reaches the receiving recess through the insertion hole, the engagement portion engages the engaged portion of the lid disposed in the receiving recess, and engagement of the engagement portion and the engaged portion and release of the engagement are achieved by movement of the latch main body along the axis.

In the closed container described above, it is preferred that the engaged portion have an L-shape including a first straight portion that extends along a direction in which the outer peripheral surface of the flat plate-like shape extends, and a second straight portion that extends along the thickness direction of the lid and has an open end on one side of the flat plate-like shape, and the engagement portion is capable of engaging an inner wall that defines the first straight portion of the L-shape, and the engagement is released when the engagement portion is moved into the second straight portion by movement of the latch main body along the axis. In this case, it is also preferred that the first straight portion and the second straight portion in the engaged portion constitute a recess that opens on an outer peripheral surface of the flat plate-like shape. It is also preferred that the inner wall have a shape of at least one of an undulated surface and an inclined surface that causes a biasing force that the engagement portion exerts on the inner wall to change as the engagement portion moves toward an end of the first straight portion that is different from an end at which the first straight portion joins with the second straight portion. It is also preferred that the engagement portion have a disk-like roller that can roll while in contact with the inner wall. Furthermore, it is preferred that the latch mechanism further comprise biasing means for exerting, to the engagement portion, a biasing force that retains the engagement portion stationary at a position at which the engagement portion engages the engaged portion. It is also preferred that the latch main body further comprise a slide rail that supports the latch mechanism in such a way that the latch mechanism is movable along the axis, and the slide rail be disposed on a surface of the flange portion on the container body side.

To achieve the above described object, according to the present invention, there is provided a lid opening and closing system that opens and closes the lid of a closed container according to claim 1 to allows the object to be brought into/out of the interior of the closed container, comprising: a mini-environment having an opening portion; a door that can move between a position at which it substantially closes the opening portion and a position at which it leaves the opening portion open; and a latch mechanism drive means that can operate the latch mechanism when the closed container is at a position at which opening and closing of the lid by the door is performed, the latch mechanism drive means being disposed in the vicinity of the opening portion. In this lid opening and closing system, it is preferred that the latch mechanism drive means comprise a rod that is disposed coaxially with the axis, which is an axis of movement of the latch main body, and capable of pushing the latch mechanism along the axis of movement, and an actuator that supports the rod in such a way as to be capable of extending and retracting the rod along the axis of movement. It is also preferred that the lid opening and closing system further comprise a container support table that moves the closed container toward or away from the opening portion in a state in which the closed container is placed thereon, wherein the latch mechanism drive means comprises a cam mechanism including a cam surface that is movable relative to the container support table with movement of the container support table and cam means that is disposed on the container support table and follows the cam surface, the cam mechanism exerting a pushing force on the latch mechanism in accordance with a change in the cam surface caused by movement of the container support table. Furthermore, it is also preferred that the lid opening and closing system further comprise a flange cover that covers an outer peripheral surface of the flange portion when the closed container is at a position at which the lid is opened and closed.

According to the present invention, in the state in which the lid is fixed on the pod, the surface of the lid is flat. In addition, the lid does not have a movable member that is to be accessed and operated from the outside. Therefore, generation of dust with operation of a so-called latch tongue on the front surface of the door, which conventional systems have, can be completely eliminated. In addition, the lid is a simple flat plate-like member that does not have structures provided in the interior thereof, unlike with conventional lids.

Therefore, dust or the like can easily be removed by cleaning. In addition, dust particles or the like do not adhere on the lid in a manner that removal thereof is difficult, and the degree of cleanness of the lid alone can be maintained high. Specifically, since the engaged recess provided on the lid has a simple groove shape, machining and cleaning of the lid is much easier than conventional lids. Change of the diameter of wafers used in semiconductor manufacturing process from 300 mm (the diameter of currently used wafers) to 450 mm have been considered. In pods that store such large-diameter wafers, it is required, with an increase in the size of the lid, to prevent deformation such as warpage and bending of the lid and to fix the lid reliably with adequate strength in fixation. The lid of the pod according to the present invention has a simple flat plate-like structure, and therefore the lid can easily be made light in weight, and the structure that adds rigidity of the lid while achieving a decrease in the weight can be used. Thus, such requirements can easily be met with reliability.

According to the present invention, it is also possible that the lid be adapted to be always biased in the direction for sealing the pod opening in the state in which the lid is fixed on the pod body. This enables improvement in the air tightness of the pod and reduction of possibility of dust generation due to vibration of the lid during transferring etc. Furthermore, since the surface of the lid can be made flat, a seal member may be provided on the lid or the surface of the door opposed thereto to isolate the space defined between the lid and the door from the surrounding space. Thus, diffusion of dust or air coming from the outer space that the lid has brought into the mini-environment is prevented with reliability. In addition, by reducing the pressure in the closed space formed between the lid and the door by the seal member, additional holding of the lid by the door can be provided besides holding of the lid by suction. Furthermore, means for opening and closing the lid is disposed and operates basically in the region outside the pod and the mini-environment. Therefore, if dust is generated from this means, frequency of diffusion of such dust into the pod or the mini-environment is greatly reduced as compared to conventional systems.

In the present invention, what is called a latch mechanism for fixing the lid to the pod may be adapted to be driven in the vertical direction and fixation of the lid is designed to be achieved at a lower position. In this case, fixation of the lid to the pod is achieved by the latch mechanism's own weight. Thus, even when an operation error occurs in the means for driving the latch mechanism upon opening or closing the lid, the latch mechanism can be kept in the position for fixing the lid. Thus, the lid can be kept closed, and the interior space of the pod can continue to be kept clean. In the structure disclosed in Japanese Patent Application Laid-Open No. 2001-077177, for example, in a situation in which the key member and the operated portion of the latch mechanism can hardly be separated due to, for example, erroneous engagement, it may be necessary, for example, to disassemble the lid in order to separate them. In the case of the container according to the present invention, access to the latch mechanism can be made from the external space outside the mini-environment (e.g. from the lateral side of the pod) to forcibly cause the latch mechanism to operate. Therefore, if the latch mechanism becomes inoperable by malfunction, it is possible to repair the trouble relating to the latch mechanism easily by performing the forcible operation. Furthermore, whether the latched state has been appropriately established or not can easily be checked from outside with eyes without providing additional means or operation.

In the present invention, in the drive mechanism for operating the latch mechanism, the size of an operation portion (i.e. drive contact surface that will be described later) for operating the latch mechanism may be arbitrarily designed. Therefore, the degree of accuracy in the position at which the pod is kept when the lid is opened by the door may be lower than in the case of conventional systems. In the case of conventional systems, detachment of the lid from the pod and establishment of communication between the interior space of the pod and the mini-environment cannot be performed unless a high degree of accuracy is achieved in all of the fixed position of the lid relative to the placement position, the fixed position of the pod relative to the opening portion and the position of contact of the door to the lid determined by the latch mechanism. According to the present invention, at least requirement for accuracy of the fixed position of the lid and pod determined by the latch mechanism is relaxed, which advantageously leads, for example, to a simplification of the operation program of the lid opening and closing apparatus and stability of operation.

DESCRIPTION OF THE PREFERRED EMBODIMENTS

Figure 1A:
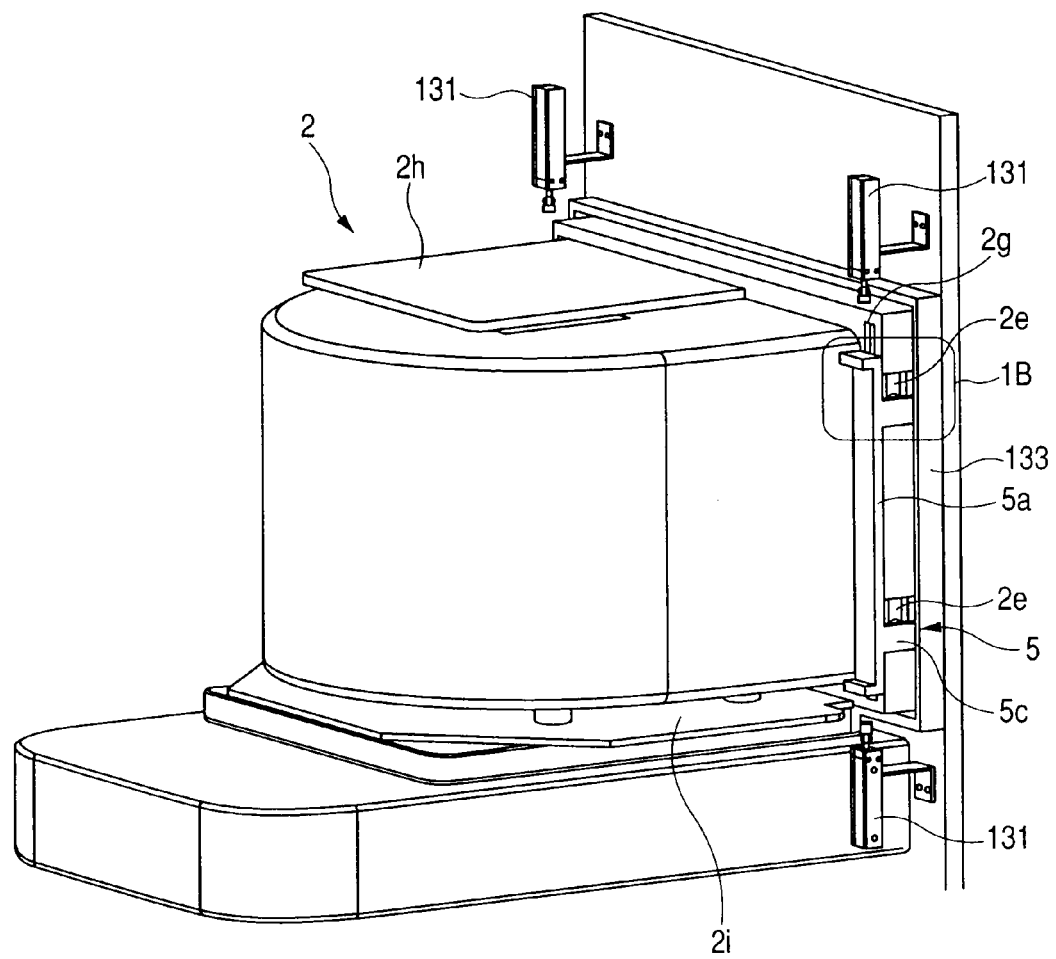
FIG. 1A is a perspective view showing the general structure of the relevant portion of a pod according to an embodiment of the present invention and a lid opening and closing system corresponding thereto.
Figure 1B:
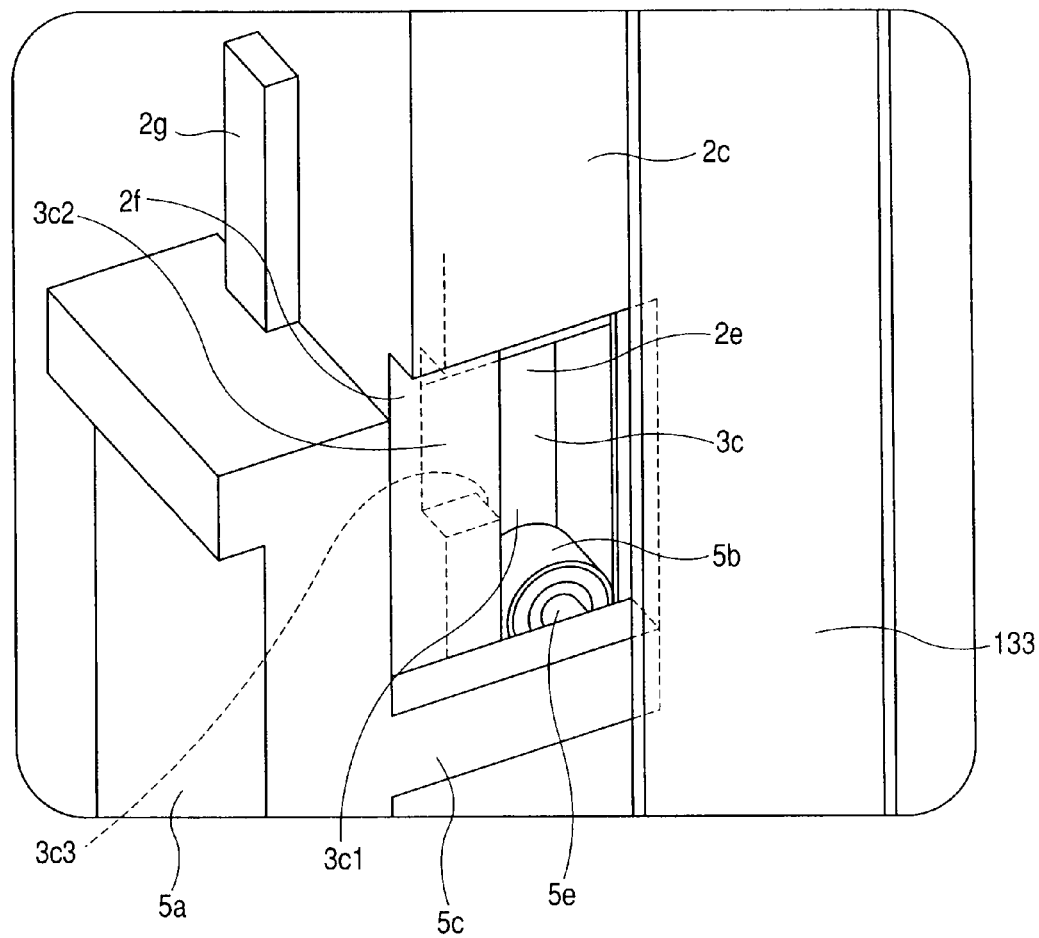
FIG. 1B is an enlarged view showing a portion 1B in FIG. 1A.
Figure 2:
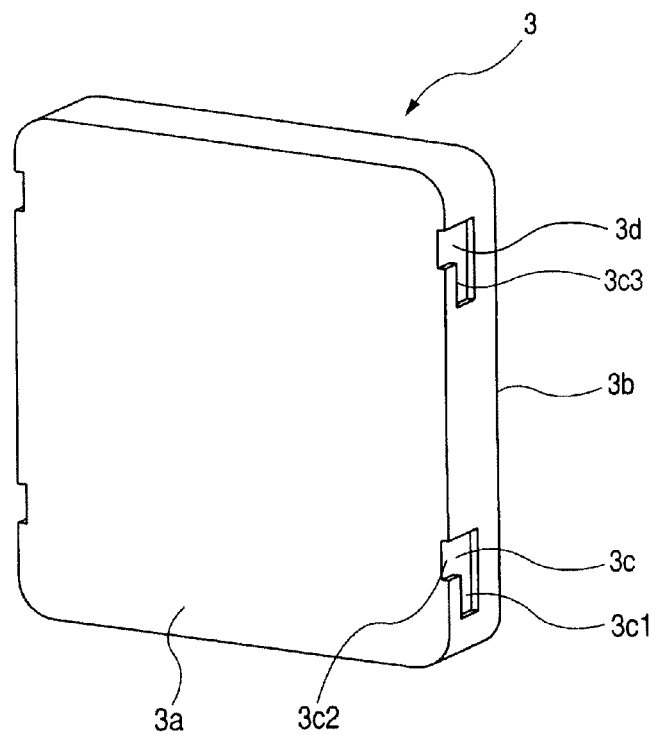
FIG. 2 is a perspective view showing the structure of the lid of the pod shown in FIG. 1A.
Figure 3:
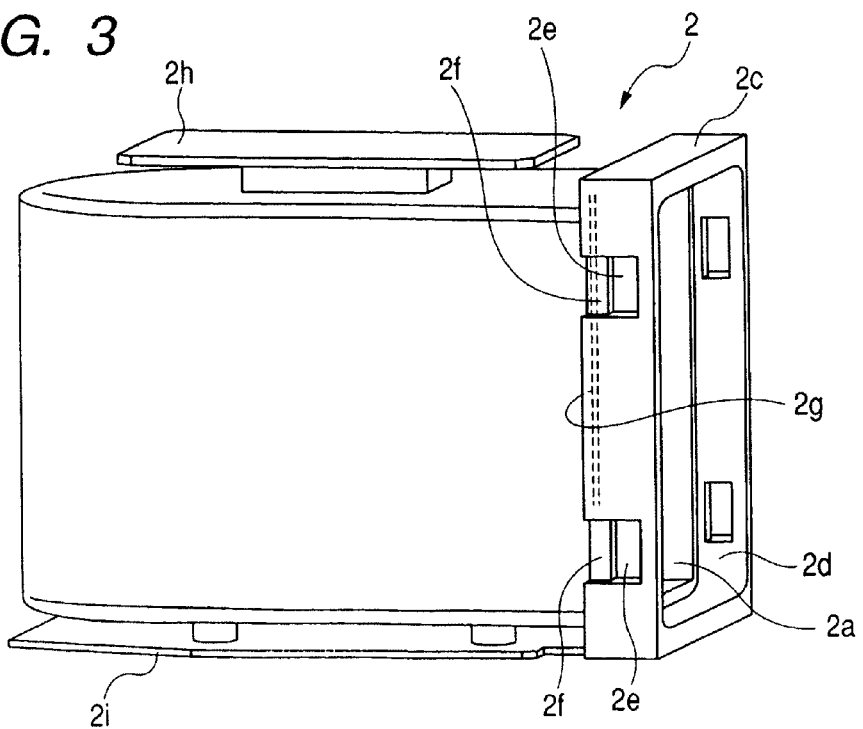
FIG. 3 is a perspective view showing the structure of the pod body of the pod shown in FIG. 1A.
Figure 4:
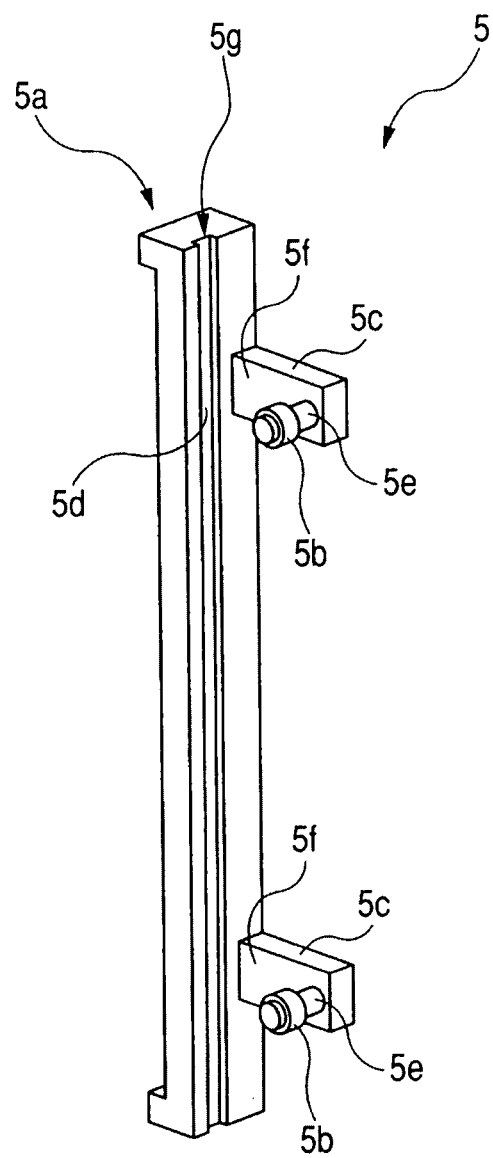
FIG. 4 is a perspective view showing the structure of the latch mechanism of the pod shown in FIG. 1A.
Figure 5A:
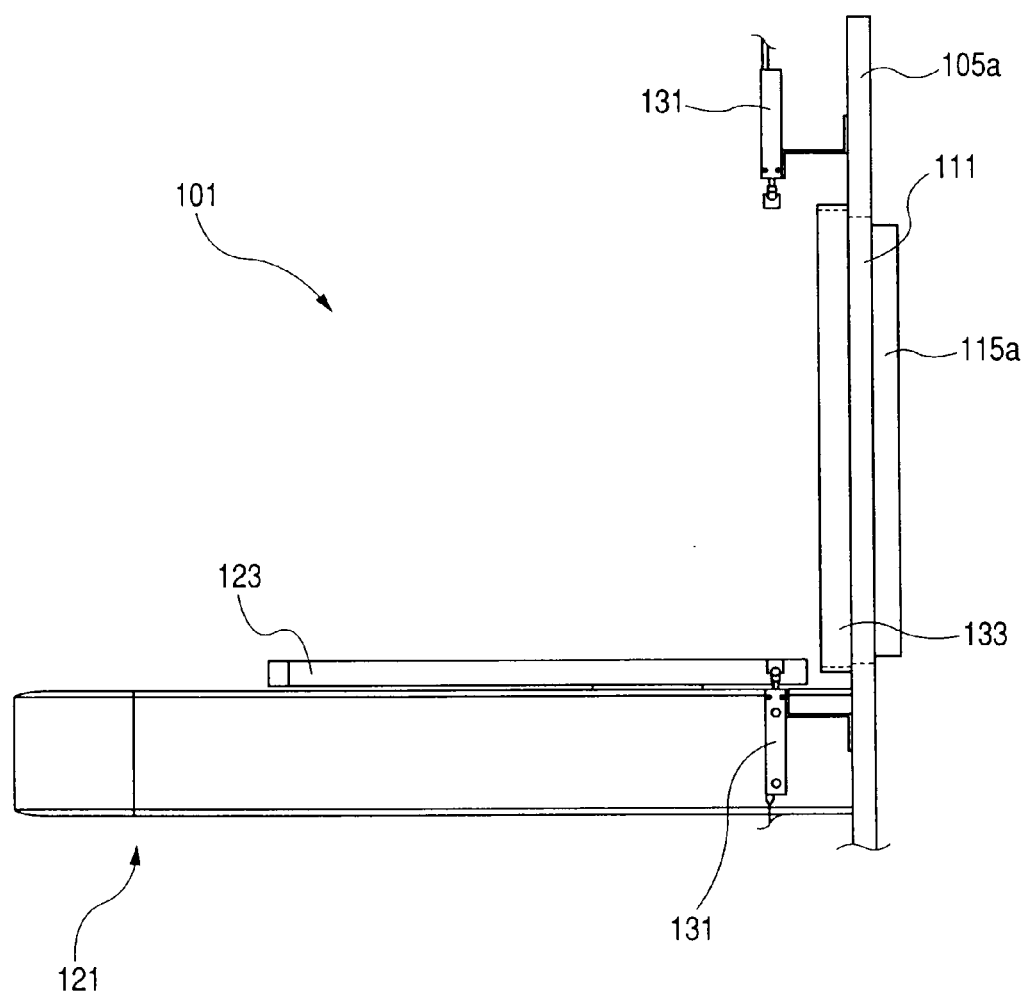
FIG. 5A is schematic diagram showing the relevant portion of the lid opening and closing system shown in FIG. 1A.
Figure 5B:
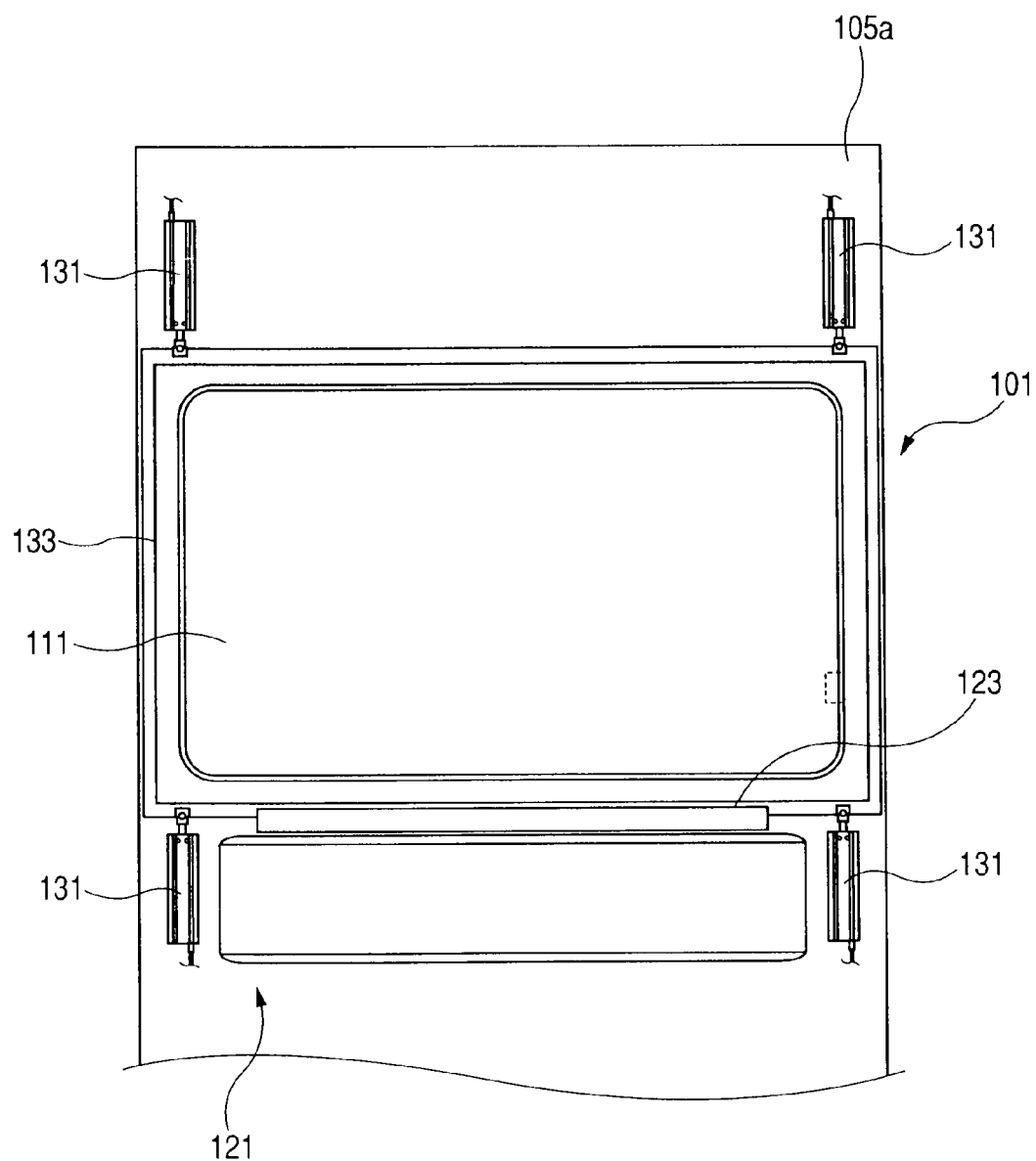
FIG. 5B is a schematic diagram showing the portion shown in FIG. 5A as seen from the external space or the front side.

In the following, an embodiment of the present invention will be described with reference to the drawings. FIG. 1A is a perspective view of a pod as an embodiment of the closed container according to the present invention and a FIMS in the form of a lid opening/closing system in a state in which the pod is placed at a position at which the lid is to be closed or opened. FIG. 1B is an enlarged view of region 1B in FIG. 1A showing the engagement of a roller portion of a latch mechanism, which will be described later, in the state as shown in FIG. 1A. FIG. 2 is a schematic perspective view of the lid of the pod. FIG. 3 is a schematic perspective view of the body of the pod. FIG. 4 is a schematic perspective view of the latch mechanism fixed on the pod body. FIG. 5A is a side view of a support table and a wall in which an opening portion of a mini-environment is provided. FIG. 5B is a front view of them as seen from the side on which the pod is disposed.

The pod 1 as a closed container according to the present invention is composed of a pod body 2 as a main body of the container, a lid 3 and a latch mechanism 5 attached to the pod body 2 in a slidable manner. The pod body 2 is of a substantially cubical shape and has an interior space in which a plurality of contents such as wafers are stored one above another along the vertical direction. The pod body may have various shapes in which wafers can be stored. However, the basic shape of the pod is a cubical shape, and in this sense we describe it as a substantially cubical shape in this specification. The pod body 2 has an opening 2a allowing communication with the storage space on one side face of the substantially cubical shape. The opening 2a allows communication between the above described interior space and the exterior space. On the aforementioned lateral side is also provided a flange portion 2c that extends outwardly from the periphery of the opening 2a in a plane parallel to an opening plane that contains the opening 2a in such a way as to surround the periphery of the opening 2a. The flange portion 2c has a lateral end surface that is parallel to the aforementioned side face. The lateral end surface is to be opposed to a wall having an opening of a load port serving as a lid opening/closing system that will be described later. The flange portion 2c has a thickness larger than the thickness of the lid 3. The flange portion 2c has a receiving recess 2d into which the lid 3 is to be fitted when the opening 2a is closed by a flat surface (rear surface 3a that will be described later) of the lid 3 having a flat plate-like shape. Thus, the lid 3 is received in the receiving recess 2d when the opening 2a is closed by it.

On the outer peripheral surface of the flange portion 2c, namely on the outer side surfaces thereof in this embodiment, are provided roller portion insertion holes 2e having rectangular shapes as insertion holes that pass from the exterior space to the receiving recess 2d. The roller portion insertion holes 2e are provided at two positions or upper and lower positions on each of the outer side surfaces of the flange portion 2c. In this embodiment, slide rails 2g on which the latch mechanism 5 is to be supported are also provided on the flange portion 2c. The slide rail 2g is disposed on the rear surface of the flange portion 2c (the surface on the pod body side) or the surface that is opposite to the aforementioned lateral end surface in such a way as to be adjacent to the outer side surface and extend in the direction in which the outer side surface extends. Furthermore, the pod body 2 has a hold flange 2h to be held by a pod transfer robot (not shown) provided on the top thereof and a fixation flange 2i provided on the bottom thereof and to be in actual contact with the support table and to be fixed thereon. The fixation flange 2i is provided with an engaged portion etc. (not shown). The hold flange 2h and the fixation flange 2i have nothing to do with the characterizing features of the pod according to the present invention, and they will not be described in further detail.

The lid 3 in this embodiment is a flat plate-like member having a rear surface 3a to face the interior space when the opening 2a of the pod body 2 is closed by the lid 3 and a front surface 3b to face the exterior space. On a outer peripheral surface of the flat plate-shaped lid 3, namely on the outer side surface in this embodiment, are provided a pair of engaged recesses 3c at upper and lower positions corresponding to the positions of the above described roller portion insertion holes 2e on the pod body 2. The pair of engaged recesses 3c include concave portions 3d. The engaged recess 3c, which serves as engaged portion, has an L-shape including a first straight portion 3c1 that extends in the direction in which the outer side surface of the lid 3 on which the engaged recess 3c is provided extends and a second straight portion 3c2 that is in communication with the first straight portion and extends in a direction perpendicular to the direction in which the first straight portion extends. One end of the second straight portion 3c2 opens at the rear surface 3a of the lid 3. The length and the width of the first straight portion are equal respectively to the length and the width of the above described roller portion insertion holes 2e provided on the pod body 2. In the first straight portion 3c1, the inner wall 3c3 located closer to the rear surface 3a of the lid 3 to constitute a part of the engagement recess serves as an engagement surface that engages with a roller portion 5b that will be described later. The front surface 3b of the lid 3 has suction areas to be held by suction by suction pads provided on the door that will be described later. The surface of the suction area has been processed by surface polishing to enable effective suction holding. On the front surface 3b of the lid 3, there are dust particles or the like that adhered to it when the pod was being transferred in a space in which the degree of cleanness is low. In view of this, in order to provide a seal by the suction pads to prevent diffusion of the dust into the mini-environment, it is preferred that the suction areas be provided to cover nearly the entire area of the front surface 3a.

The latch mechanism 5 has a latch main body 5a, roller portions 5b serving as engagement portions and link portions 5c linking the latch main body 5a and the roller portions 5b. The latch main body 5a is a rectangular column-like member extending in one direction. The latch main body 5a is opposed to the rear surface and the side surface of the flange portion 2c of the pod body 2 by a first opposed surface 5d of the latch main body 5a and a second opposed surface 5f of the link portion 5c. On the first opposed surface 5d is provided a guide groove 5g for receiving the aforementioned slide rail 2g in a slidable manner. The guide groove 5g extends along the longitudinal direction of the latch main body 5a on the first opposed surface 5d. The link portions 5c project from the surface on which the first opposed surface is provided in the direction perpendicular to the longitudinal direction of the latch main body 5a. There is a pair of such link portions 5c disposed at upper and lower positions corresponding to the aforementioned roller portion insertion holes 2e. In this embodiment, the first opposed surface 5d and the second opposed surface 5f are configured to be opposed to the flange 2c with a small gap being left between them and the flange 2c so that any contact or friction will not occur. The gap between the second opposed surfaces 5f of the link portions 5c and the flange 2c may be provided by including a recess 2f in the flange portion 2c, as best seen in FIG. 1B.

The roller portions 5b protrude into the lid receiving recess 2d through the roller portion insertion holes 2e provided on the flange portion 2c and abut to portions of the inner walls 3c3 of the aforementioned engaged recesses 3c. The roller portion 5b has a disk-like shape and is rotatably supported on the link portion 5c by a rotary shaft 5e that is perpendicular to the bottom surface. The rotary shaft 5e extends in a direction perpendicular to both the longitudinal direction of the latch main body 5a and the direction in which the link portion 5c projects. By this configuration, the roller portion 5b is translated in a plane perpendicular to the rotary shaft 5e. In other words, when the latch main body 5a slides in the longitudinal direction, the roller portion 5b rolls about the rotary shaft 5e with its outer circumference (or the outer circumference of the circular disk) being kept in contact with the inner wall while changing the position of contact with the inner wall. In this embodiment, an elastic material such as rubber is attached on the outer circumference of the disk of the roller portion 5b so that the disk has elasticity in the circumferential direction. Thus, when the roller portion 5b moves by rotation, the contact portion is prevented from sliding without rotation, whereby generation of dust can be prevented.

In this embodiment, the latch mechanism 5 is attached to the pod body 2 by the guide rail 2g and the guide groove 5g. This eliminates unnecessary contact of the latch mechanism 5 with the pod body 2, whereby generation of dust by such contact can be prevented from occurring. Alternatively, in order to attach the latch mechanism 5 to the pod body 2 more steadily to reduce play in sliding, the latch mechanism 5 may be attached to the pod body 2 by holding a portion between the inner wall of the rectangular roller insertion hole 2e and the guide rail 2g by the guide groove 5g and a portion of the outer circumference of the disk of the roller portion 5b. In this case, the aforementioned addition of the elastic material on the outer circumferential surface of the disk of the roller portion 5b enables the roller portion 5b to abut to both the inner wall of the rectangular roller insertion hole 2e and the inner wall 3c3 of the engagement recess with an appropriate pressing force. Generation of a measure of dust in the contact portions between these members cannot be avoided. Therefore, abrasion resistant materials are used taking into account abrasion characteristics in these contact portions. Alternatively, a roller having a bearing that does not generate much dust may be used, whereby generation of dust due to operation of the latch mechanism 5 can be controlled.

In the following, a way of fixing the lid 3 to the pod body 2 by the latch mechanism 5 will be described. As shown in FIG. 1A, in the state in which the lid 3 is received in the receiving recess 2d of the pod body 2 to close the opening 2a, each roller portion 5b is located at the lower position in the corresponding roller insertion hole 2e, i.e. at the closed end portion of the first straight portion 3c1 of the L-shaped engaged recess 3c. The latch mechanism 5 may be positioned at the closed end portion by the effect of its own weight. In this embodiment, the roller 5b is elastic, and the roller portion 5b is designed to bias the lid 3 at this position in such a direction as to bring the lid 3 into close contact with the pod body 2, and the roller portion 5b is retained stationary at the aforementioned position by a reaction force of the biasing force. As the latch mechanism 5 is caused to slide from the above described position upwardly in FIG. 1A to a latch release position, each roller portion 5b moves to a position at which the first straight portion 3c1 and the second straight portion 3c2 of the L-shaped engaged recess 3c meet. With this movement, the roller 5b is positioned in the second straight portion 3c2 that opens on the rear surface 3a of the lid, where there is no inner wall 3c3 to which the roller portion 5b abuts. Therefore, restraint on the lid 3 by the roller 5b no longer exists, and the lid 3 is movable in the longitudinal direction of the second straight portion 3c2, i.e. in the direction in which the lid 3 is moved away from the pod opening 2a.

In the above described embodiment, there are two latch mechanisms 5 that are disposed at the rear side edges of the respective flange portions 2c on both sides. In this embodiment, the latched state is achieved by the weight of the latch mechanisms 5 themselves. Therefore, there is no need to provide a particular mechanism to retain the latch mechanism 5 in position when the pod is stored. Thus, the structure of the pod can be made advantageously simple. Such a simple structure is also advantageous in facilitating cleaning for removing dust and in reducing possibility of adhesion of dust to the pod. In actual semiconductor manufacturing factories, semiconductor processing apparatuses arranged side by side are nearly in contact with each other. In the case of the apparatus having the above described structure, the projected area of the semiconductor processing apparatus on the floor on which it is installed does not change particularly even when a latch mechanism drive unit described later is additionally provided. However, the present invention is not limited to the above described mode. The latch mechanisms 5 may be attached on the upper and lower edges of the flange portion 2c. Furthermore, in order to increase the force for securing the lid 3 to the pod body 2, an additional roller(s) 5b may be provided on at least one of the upper and the lower edges. A plurality of roller portions may be provided for one engaged recess 3c to increase the aforementioned securing force, and the number of engaged recesses may be decreased. In the above description of the embodiment, the portion that passes through the roller insertion portion 2e is only the roller portion 5b. However, the rotary shaft 5e may also be considered to be a part of the link portion 5c, and it is preferred that the portion that passes through the roller insertion portion 2e be the roller portion 5b serving as the engagement portion and a part of the link portion 5c, and at least the portion that passes through the roller insertion hole 2e be defined as an engagement portion.

In this embodiment, the engaged recess 3c is in the form of a L-shaped recessed groove composed of the first straight portion 3c1 and the second straight portion 3c2. More specifically, both the first straight portion 3c1 and the second straight portion 3c2 are simple grooves without change in the groove width. However, the first straight portion 3C1 may have a tapered portion in which the surface to be in contact with the roller portion 5b or the inner wall 3c3 becomes closer to the rear surface of the lid 3a toward the closed end. In this case, when, for example, the roller portion 5b is at the closed end, the pressing force exerted on the roller portion 5b by the inner wall 3c3 is relaxed and the shape of the contact portion thereof is restored nearly to the circular outer circumference shape of the body, whereby it can generate, in cooperation with the tapered surface, a force that prevents the roller portion 5b from moving upward. As will be understood from the above, the engaged recess in the present invention is not limited to that in the above described embodiment, as long as it is configured in such a way as to include a non-engagement portion opening on the rear surface of the lid at one end thereof and extending in the thickness direction of the lid and an engagement portion that constitutes the inner wall 3c3 serving as an engagement surface parallel to the rear surface of the lid.

More specifically, the L-shape in the present invention includes any shape that includes a portion corresponding to the second straight portion that extends in the thickness direction to reach the rear surface and a portion corresponding to the first straight portion that extends in the direction in which the side surface extends (which is perpendicular to the thickness direction). For example, a mode in which a plurality of second straight portions are in communication with one first straight portion, a mode in which a first straight portion that is not in communication with a second straight portion is in communication with another groove at the other end to open on the front side of the lid, and various other modes may be adopted. Such continuous shapes of the groove are considered to be advantageous in facilitating ease of machining and cleaning. Instead of a simple tapered shape, for example, an additional recess may be provided on the surface to be in contact with the roller portion at the closed end in the first straight portion so that the roller portion is to be received in this recess to achieve a locked state. As above, it is preferred that a region including at least one of an undulated surface and an inclined surface be provided for the inner wall 3c3 to control a biasing force in engagement or a force for retaining the engagement state. By this feature, when the pod is stored, the closed state of the pod opening can be maintained more excellently, that is, more specifically, the closed state can be maintained for a longer time with higher sealing performance.

In this embodiment, elasticity of the circumferential surface of the disk of the roller portion 5b serves as means for retaining the latch mechanism 5 in the latching position. However, the present invention is not limited by this. For example, an elastic member like a spring may be attached to the latch main body 5a to always exert a biasing force on the latch mechanism. In this embodiment, the roller portion 5b is used as an engaging member and the inner wall 3c3 of the engaged recess is used as an engaged portion. This greatly reduces the possibility of generation of dust from the engagement portions. However, generation of dust from the rotary roller may matter in some cases. In view of this, a cylindrical contact member having high abrasion resistance may be used instead of the roller member 5b in this embodiment. In this case, the contact member may be made of a leaf spring or the like. In this embodiment, the slide rail 2g is provided on the rear side of the flange portion 2c, because in this configuration diffusion of dust toward the mini-environment is prevented by the flange portion 2c even if dust is generated from the slide rail 2g. In this embodiment, the front projected area of the pod does not change, and therefore, no particular problems arise in placing the pod even in the case where it is used in a situation in which semiconductor manufacturing apparatuses arranged side by side are close to each other. However, in order to simplify the structure of the latch mechanism, the slide rail 2g may be provided on the outer side surface of the flange portion 2c.

Furthermore, in this embodiment, in achieving the engagement state, the roller portion 5b is adapted to make access to the engaged recess 3c from the outer peripheral surface of the flange portion 2c. This mode of access facilitates ease of machining and enables checking of actual engagement state with eyes, allows the slide rail 2g and the roller insertion holes 2e to be disposed separately from each other, and enables to make the size of the roller 5b large relative to the first straight portion 3c1 thereby advantageously increasing the engagement force. However, the access may be made, for example, only from the rear side of the flange portion 2c. In this case, the engaged recess 3c may be provided in the form of a bore composed of a bore that extends along the thickness direction of the lid 3 to constitute the second straight portion and another bore that is in communication with and extending from the aforementioned bore toward a different direction to constitute the first straight portion, and it may be provided in the vicinity of the outer periphery of the rear surface 3a.

In the above described pod 1, the lid 3 is a flat plate member that is provided with only engaged recesses 3c on its outer peripheral surface. Therefore, even if it is left in a space in which dust or the like is not controlled, the possibility of adhesion of dust or the like and the possibility of deposition of dust in the interior of the lid is relatively low, because it has no holes for receiving latch keys that are provided in conventional lids. Furthermore, since most part of dust, if any, adhering on the lid will be on the flat front surface thereof, it can be easily removed by cleaning or by presence of downward air flow. In addition, since there is no need to provide conventional operation members for latch keys on the surface of the door, the structure of door can be made simple, and the degree of cleanness of the environment can be enhanced with this simplification.

In the following, a lid opening and closing system for a closed container suitable for use with the above described pod will be described. FIG. 1A shows the above described pod 1, a pod support portion 121 of the lid opening and closing mechanism 101 that will be described later, a docking plate 123, a door 115a, a first opening portion 111, a cabinet wall 105a, latch mechanism drive units 131 and a flange cover 133. Characteristic features of this lid opening and closing system 101 include the latch mechanism drive units 131 serving as means for driving the latch mechanism and the flange cover 133. In this embodiment, the latch mechanism drive unit 131 includes an actuator having a rod that can extend and retract along one axis. The latch mechanism drive unit 131 is disposed in such a way that when the lid 3 of the pod 1 is at the position at which it is held by suction by the door 115a, the axes of the latch main bodies 5a of the latch mechanisms and the axes of the rods of the corresponding actuators are aligned, and the rods are opposed to each other above and below the latch main bodies 5a.

In other words, each latch mechanism drive unit 131 is composed of the rod that is disposed coaxially with the axis of movement of the corresponding latch main body 5a and capable of pushing the latch mechanism 5 along the axis of movement and an actuator that supports the rod in such a way that the rod can extend and retract along the axis of movement. Thus, the latch mechanism drive unit 131 in this embodiment is disposed at a position aligned with the corresponding latch mechanism 5 of the pod 1 placed at the position at which the lid 3 is detached so that it can push to drive the latch mechanism 5 in the vertical direction. It is preferred that the center axis of the rod be aligned with the axis of movement of the latch mechanism 5. The upper and lower end faces of the latch main body 5a of the latch mechanism 5 serve as surface to be pressed or the aforementioned contact drive surfaces. Thus, the end of the rod presses this surface to be pressed to drive the latch mechanism 5 along the axial direction.

Figure 6A:
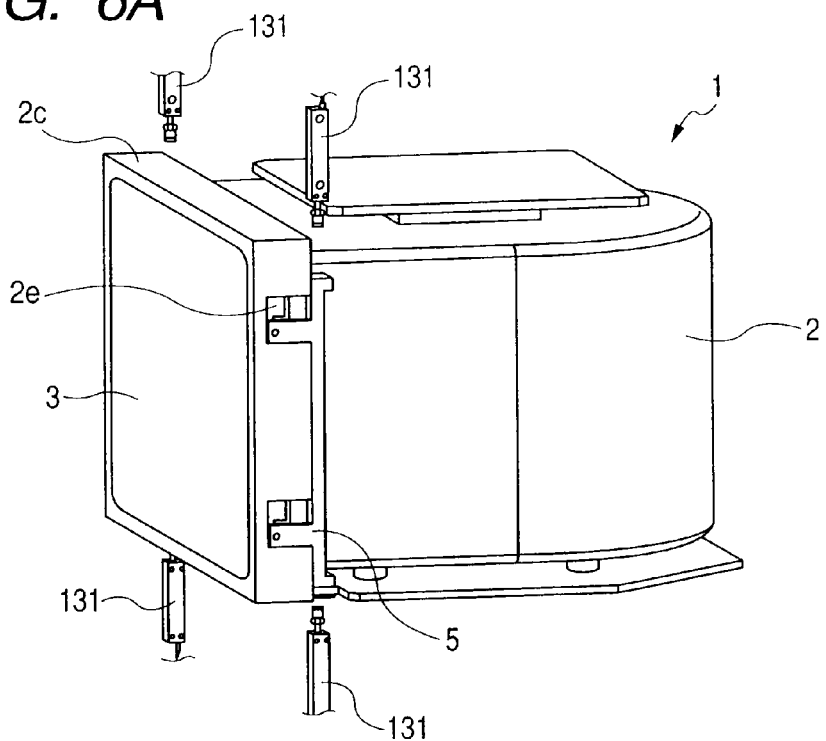
FIG. 6A is a diagram for illustrating a mode of operation of a latch mechanism drive unit and the pod shown in FIG. 1A.
Figure 6B:
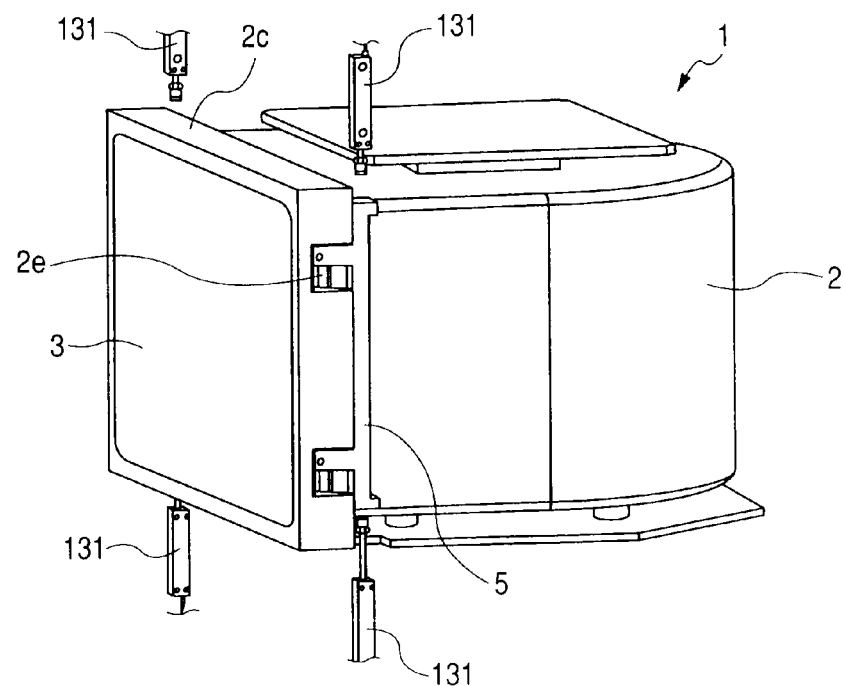
FIG. 6B is a diagram for illustrating a mode of operation of the latch mechanism drive unit and the pod shown in FIG. 1A.
Figure 6C:
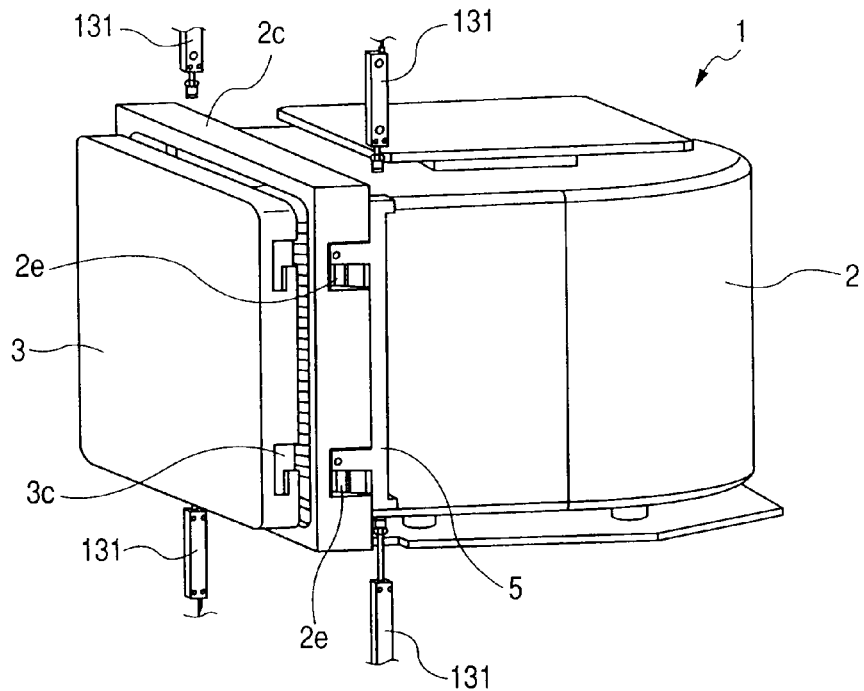
FIG. 6C is a diagram for illustrating a mode of operation of the latch mechanism drive unit and the pod shown in FIG. 1A.

Here, the operation sequence of the latch mechanism drive unit 131 upon actually opening and closing the lid 3 will be described with reference to FIGS. 6A to 6D. FIGS. 6A to 6D are perspective views showing only the pod 1 and the latch mechanism drive unit 131. FIG. 6A shows a state in which the pod 1 is placed at a position at which the lid 3 thereof is opened and closed by the door 115a. In this state, the surfaces to be pressed of the latch mechanisms 5 are spaced apart from the rod ends of the corresponding latch mechanism drive units 131. The latch mechanism drive units 131 disposed below start to operate from this state and extend their rods to press the lower end surfaces of the latch main bodies 5a to move the latch mechanisms 5 upwardly as shown in FIG. 6B. By this operation, each roller portion 5b is positioned in the second straight portion 3c2 in the engaged recess 3c. In this position, engagement of the roller 5b and the engaged recess 3c has been released, and the lid 3 can be detached from the pod body 2. As described before, the roller portion 5b has an elastic material provided on the outer circumference of its disk, and the roller portion 5b is always in contact with the inner wall of the engaged recess 3c with a biasing force generated by its elasticity.

Figure 6D:
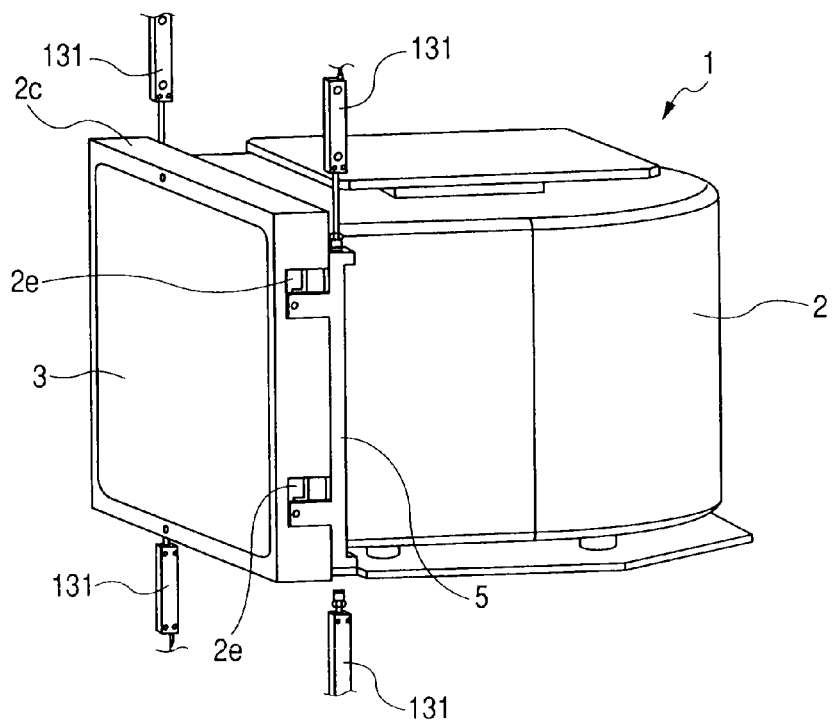
FIG. 6D is a diagram for illustrating a mode of operation of the latch mechanism drive unit and the pod shown in FIG. 1A.

After the above described state is achieved, the lid 3 is held by suction by the door (not shown in FIG. 6C) and the lid 3 is detached from the pod body 2 as the door moves. Thereafter, wafers stored in the interior of the pod body 2 are taken out through the opening 2a of the pod body 2 thus opened, and wafers having been processed by the processing apparatus are brought into the interior of the pod body 2. After transfer of all the wafers has been completed, the lid 3 is moved by the door back to the position shown in FIG. 6C, and then operation for closing the opening 2a with the lid 3 is performed. Thereafter, as shown in FIG. 6D, the latch mechanism drive units 131 disposed below the pod 1 retract the rods, and the latch mechanism drive unit 131 disposed above the pod 1 start their operation to extend the rods, thereby pressing the upper end faces of the latch main bodies 5a, whereby the latch mechanisms 5 are moved downwardly. Thus, each roller portion 5b is located in the first straight portion 3c1 in the engaged recess 3c. In this position, engagement of the roller portion 5b and the inner wall 3c3 is established, and the lid 3 is fixed to the pod 2. After the engagement is achieved, the latch mechanism drive units 131 disposed above the pod 1 retract the rods. Thus, the state of the system returns to that shown in FIG. 6A. By the above described operations of the latch mechanism drive units 131, a sequence from detaching to attaching of the lid 3 from/to the pod 1 is performed.

The lid opening and closing system according to the embodiment of the present invention is further provided with a flange cover 133. The flange cover 133 is an annular structure having an inner peripheral surface that can be opposed to the entire outer peripheral surface of the flange portion 2c of the pod 2. The flange cover 133 is provided in such a way as to project perpendicularly from the cabinet wall 105a on the side on which the pod 1 is placed (i.e. on the exterior space side). In the state in which the pod 1 is placed at a position at which the lid 3 is opened and closed by the door 115a, the flange cover 133 covers the outer peripheral surface of the flange portion 2c of the pod 2 to block passages that directly lead from the exterior space to the outer peripheral surface. In this embodiment, there are passages leading from the exterior space to the storage space 2d in the pod body 2 through the roller portion insertion holes 2e whether the latch mechanism 5 is at a position at which it engages the lid 3 or a position at which it does not engage the lid 3. The interior of the pod is typically kept at a positive pressure in relation to the exterior space that is in communication therewith thanks to the effect of clean air supplied to the mini-environment. Therefore, in conventional systems, outward air flow is present in the roller portion insertion holes 2e, and there are no problems in dust control. In this embodiment, the flange cover 133 is further provided, whereby passages leading from the storage space 2d to the exterior space formed substantially through the roller portion insertion holes 2e can be made as small as possible. By this feature, it is possible to prevent very small dust particles from entering the storage space 2d through the roller insertion holes 2e by, for example, expansion of the region of molecular motion.

In the above described embodiment, two actuators or latch mechanism drive units 131 are disposed respectively above and below each latch mechanism 5. By this arrangement, the structure of the latch mechanism 5 can be made simple, and the possibility of entrance of dust is advantageously reduced. However, the advantages of the present invention associated with disposition of the latch mechanism 5 can be achieved also by additionally providing biasing means for biasing the latch mechanism 5 in the axial direction and disposing a latch mechanism drive unit 131 either above or below the latch mechanism 5. Furthermore, for example, a latch mechanism drive unit 131 may be constructed by providing a cam surface in the form of an inclined surface or slope that rises or falls relative to the docking plate 123 in a direction along the direction of movement of the docking plate 123 and cam means that is in contact with the cam surface to follow it so that a rod or the like moves upward or downward with operation of the cam means. In other words, a kind of cam mechanism may be provided between the pod support table (or a container support table) and the latch mechanism drive unit, and the latch mechanism drive unit may be driven by the cam mechanism. By this feature, a drive source for driving actuators or the like can be eliminated.

In this embodiment, the flange portion 2c is fully covered with the flange cover 133, whereby direct communication between the storage space 2d and the exterior space through the roller portion insertion holes 2e is prevented. This configuration is advantageous, for example, in facilitating ease of cleaning of the roller insertion holes 2e and the roller portions 5b. Alternatively, for example, the thickness of the link portion 5c may be made so small that the roller portion 5b and the link portion 5c can be received in the roller portion insertion hole 2e, and the receiving portion may be covered with a cover. In this case, advantages of the present invention can be achieved without providing an additional member on the lid opening and closing system.

In the above described mode, the closed container according to the present invention can be used only by adding the latch mechanism drive units 131 and the flange cover 133 to a conventional lid opening and closing system. This additional features does not cause a particular change in the actual projected area of the semiconductor processing apparatus on the floor on which it is installed. Therefore, it is easy to modify an existing semiconductor manufacture line to enable use of the closed container according to the present invention. With the above described configuration of the lid opening and closing system, the closed container according to the present invention can be used, and the above described various advantages provided by the closed container can be enjoyed. Although it is preferred that the flange cover 133 be provided, it may be difficult to provide it in some cases due to, for example, a specific structure of the docking plate 123. In such cases, if the semiconductor manufacturing process is compliant with conventional design rules, the flow rate of clean air supplied from the mini-environment into the pod may be increased to prevent entrance of dust particles having sizes that will matter.

Figure 7:
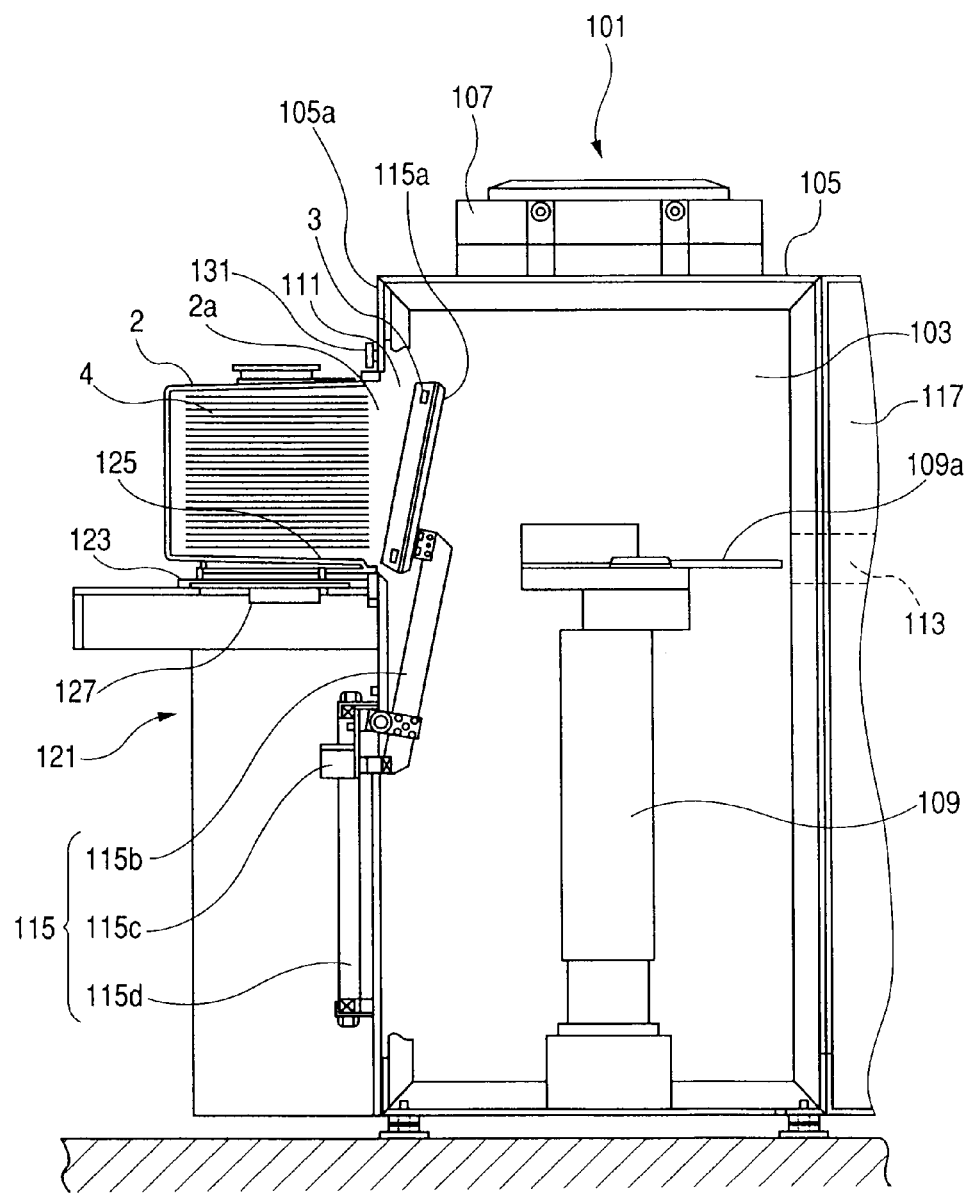
FIG. 7 is a side cross sectional view showing the general structure of a load port apparatus according to an embodiment of the present invention.
Figure 8:
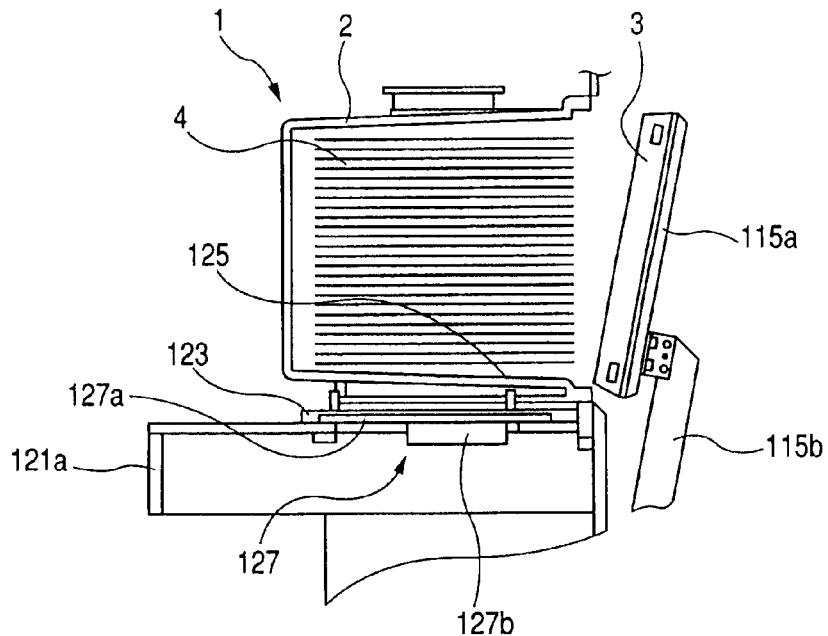
FIG. 8 is an enlarged side cross sectional view showing the general structure of the relevant portion of the load port apparatus according to an embodiment of the present invention in a manner similar to FIG. 7.
Figure 9:
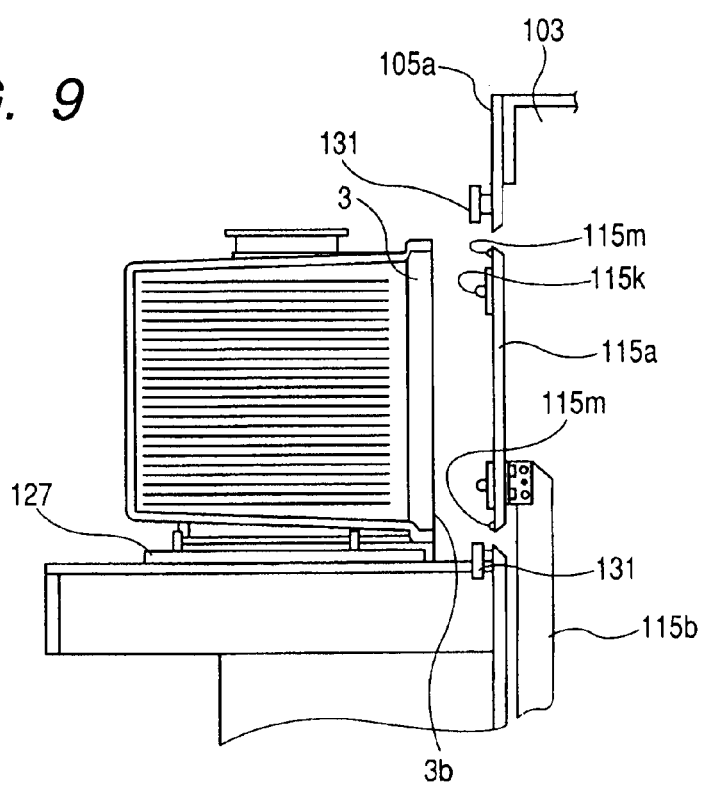
FIG. 9 shows the portion shown in FIG. 8 in the state in which the pod is located at the loading position.

Next, the lid opening and closing system adapted to the closed container according to the present invention will be described. FIG. 7 is a cross sectional side view showing the general structure of the system. FIG. 8 is an enlarged view showing a pod support portion, a door, a pod and a lid etc. in the system 101 in a similar manner. FIG. 9 schematically shows the pod support portion and the door etc. in the state in which the opening of the pod is closed by the lid. The lid opening and closing system 101 has a cabinet 105 that defines a mini-environment 103 and a pod support portion 121 provided adjacent to the cabinet 105. The cabinet 105 is provided with a fan 107, a robot 109, a first opening 111, a second opening 113 and a door system 115. The fan 107 is provided on the cabinet 105 in the upper portion of the mini-environment 103 to introduce the air in the space outside the cabinet 105 into the mini-environment. The fan 107 is equipped with a filter suitable for the degree of cleanness in the exterior space to remove contaminant such as dust from the air introduced from the exterior space. The bottom portion of the cabinet 105 has a structure that allows the air to flow to the exterior. Thus, dust particles or the like generated in the mini-environment 103 are brought by the air flow and discharged to the exterior space from the bottom of the cabinet 105.

A robot arm 109a of the robot 109 can extend to the exterior of the mini-environment trough the first opening 111 and the second opening 113. The first opening 111 is closed, in a way, by the door 115a of the door system 115, where a gap is left between the outer periphery of the door 115a and the inner peripheral surface of the first opening 111. Thus, it should be said that the door 115a can nearly close the first opening 111. The second opening 113 leads to the interior of a wafer processing apparatus 117. The details of the wager processing apparatus 117 will not be described in this specification, since they have no direct bearing on the present invention. The latch mechanism drive unit 131 and the flange cover 133 have been already described, and no further description will be made. In addition, to facilitate understanding, the flange cover 133 is not illustrated in FIGS. 7 to 9.

The pod support portion 121 has a docking plate 123, a pod fixing system 125 and a docking plate drive system 127. The upper surface of the docking plate 123 is substantially flat, and some portions of the pod fixing system 125 is provided thereon. The pod 1 according to the present invention is placed on the upper surface of the docking plate 123, and the aforementioned portions (specifically, in the form of pins) of the pod fixing system 125 come into engagement with engaged portions (not shown) provided on the bottom surface of the pod 1 to fix the pod 1 at a prescribed position on the docking plate 123. The docking plate 123 is configured in such a way that the opening 2a of the body of the pod 1 is just opposed to the above described first opening 111 when the pod 1 is placed on the upper surface of the docking plate 123. The docking plate drive system 127 drives the docking plate 123 and the pod 1 fixed at the prescribed position thereon toward/away from the first opening 111 using a guide rail 127a and a drive cylinder 127b.

One end of the drive cylinder 127b is fixed to the body 121a of the support table, and the other end or the end of an extendable/retractable cylinder is fixed to the docking plate 123. The docking plate 123 is supported on the guide rail 127a in a slidable manner so that it can slide on the guide rail 127a with extension/retraction of the cylinder end of the drive cylinder 127b. The docking plate 123 is located farthest from the mini-environment 103 when it is at a position that allows placement of the pod 1 onto it from the exterior (loading) or removal of the pod 1 from it (unloading), and closest to the mini-environment 103 when it is at a position that allows detachment of the lid 3 of the pod 1.

On the surface of the door 115a are provided suction pads 115k. The suction pads 115k are supplied with a negative pressure from a negative pressure source 108 (see FIG. 10) through pipes (not shown) when they are in contact with the lid 3, whereby the lid 3 is sucked by the suction pads 115a. Thus, the lid 3 can be held by the door 115a. The door system 115 includes a door arm 115b, a door opening and closing actuator 115c and a door elevator mechanism 115d. The door arm 115b is a rod-like member. The door arm 115b supports the door 115a at one end and is connected to the door opening and closing actuator 115c at the other end. The door arm 115b is pivotally supported by a pivot shaft at an appropriate intermediate position so as to be able to swing about that position. The door arm 115b is swung about the rotation center axis by the door opening and closing actuator 115c, whereby the end of the door arm 115b and the door 115a supported thereon are moved toward or away from the first opening 111. The door elevator mechanism 115d supports the door opening and closing actuator 115c and the pivot shaft of the door arm 115b and has a vertical movement actuator to move the actuator, the door arm 115b and the door 115a along the vertical direction along a guide extending in the vertical direction.

As shown in FIG. 9, a substantially annular seal member 115m is provided in the periphery of the surface of the door 115a that is opposed to the lid 3 so that the seal member 115m cooperates with a seal surface provided on the front surface 3b of the lid 3. In the state in which the lid 3 is held by suction by the suction pads 115k provided on the surface of the door 115a, the seal member 115m is in close contact with the seal surface 3c. Small dust particles or the like adhering on the front surface of the lid 3 are confined in a sealed space thus formed, whereby diffusion of dust particles to the environment is prevented. In this embodiment, the lid 3 is held only by the suction pads 115k. However, an evacuation port for suction may further be provided on the front surface of the door to evacuate the space that is defined by the door 115a, the lid 3 and the seal member 115m and sealed by the seal member 115m. In this case, small dust particles or the like can be removed positively, and the lid 3 can be held more firmly by the door 115a. Alternatively, the suction pads 115k may be eliminated, and the seal member 115m may be used as a kind of suction pad.

Figure 10:
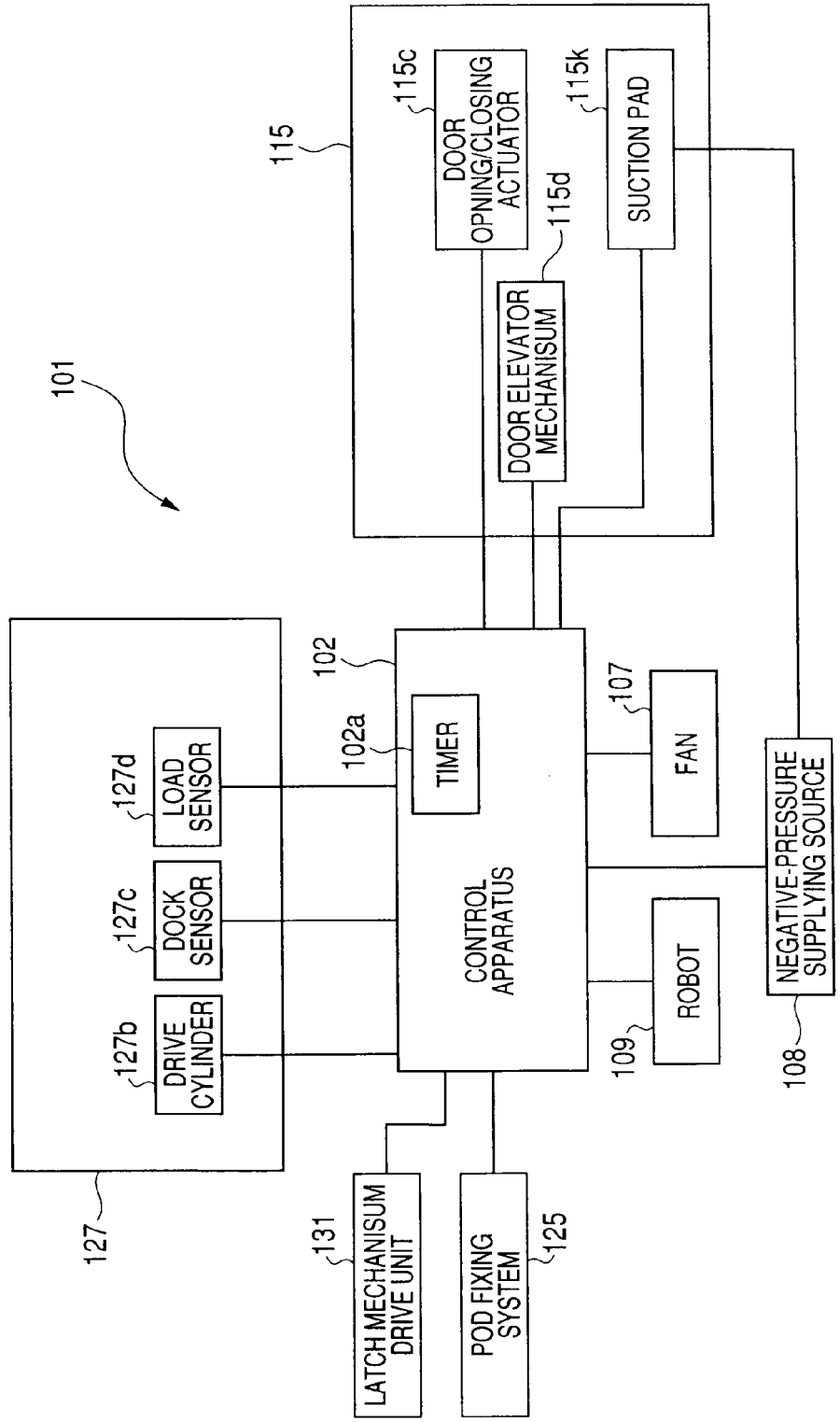
FIG. 10 is a block diagram showing the general configuration of the lid opening and closing system according to the embodiment of the present invention.

FIG. 10 is a block diagram showing the configuration of this FIMS system 101. The above described fan 107, robot 109, door system 115, pod fixing system 125 and docking plate drive system 127 are controlled by a control apparatus 102 having a timer 102a. The door closing and opening actuator 115c and the door elevator mechanism 115d in the door system 115 may be controlled independently from each other. However, in the actual operation, they are controlled in such a way that they operate according to a sequence time chart. The latch mechanism drive unit 131 is also controlled by the control apparatus 102 so as to operate in synchronization with the aforementioned operation sequence of the door system 115. Supply of negative pressure to the suction pads 115k from the negative pressure source 108 and shutting-off thereof (breaking of the negative pressure) are controlled by the control apparatus 102.

The docking plate drive system 127 turns on and off the driving by the drive cylinder 127b. It is necessary to detect, with reliability, two predetermined position of the docking plate 123 driven by the operation of the drive cylinder 127, namely the load position that allows placement of the pod 1 and the dock position that allows transfer of wafers from/into the pod 1. For this purpose, to the docking plate drive system 127 is connected a load sensor 127d that detects placement of the pod 1 on the docking plate 123 and presence of the docking plate 123 at the position allowing loading and unloading the docking plate 123 with the pod 1. In addition, to the docking plate drive system 127 is also connected a dock sensor 127c that detects whether or not the docking plate 123 is present at the above described dock position. In the present invention, since the lid 3 has high stiffness and is hard to deform, and switching between engagement and disengagement of the latch mechanism 5 is achieved by operation along only one axis, the possibility of failure of engagement of the latch mechanism 5 is much lower than that in conventional structures. In view of this, in this embodiment, an on/off signal indicative of the extended/retracted state of the rod is generated and supplied to the latch mechanism drive unit 131, and engagement and disengagement of the lid 3 and the pod body 2 are detected by this on/off signal. The present invention is not limited by this mode of detection. The engaged/disengaged state may be detected by directly sensing the operation of the latch mechanism 5 using, for example, an optical sensor.

In the following, the operation of the lid opening and closing system 101 in actual wafer processing operations will be described. In wafer processing operations, a pod 1 containing a predetermined number of wafers and filled with clean air is placed on the docking plate 123. When the pod 1 is placed on the docking plate 123, the pod fixing system 125 operates to achieve the prescribed position of the pod 1 on the docking plate 123. Thereafter, the docking plate drive system 127 operates to move the pod 1 toward the first opening 111. Specifically, the pod 1 that has been made integral with the docking plate 123 by the pod fixing system 125 is moved by driving the docking plate 123 by the drive cylinder 127b. During this operation, the door 115a is kept stationary at the position at which it substantially closes the first opening 111. The driving operation is completed when the lid 3 of the pod 1 abuts the abutment surface of the door 115a, and a prescribed positional relationship between the docking plate 123 and the first opening portion 111 is achieved. At this time, the latch mechanism drive units 131 and the latch mechanisms 5 are in the prescribed positional relationship as shown in FIG. 6A and other drawings. In this state, the latch mechanisms drive unit 131 start to operate, and engagement of the pod body 2 and the lid 3 is released. Simultaneously, the suction pads 115k suck the lid 3, whereby the lid 3 is held by the door 115a. In addition, the space formed between the front surface of the lid 3 and the surface of the door 115a is brought into a sealed state by the seal member 115m.

In this state, the door opening and closing actuator 115c starts to operate. Thus, the door arm 115b swings to move the door 115a that is holding the lid 3 from the first opening 111 to the interior of the mini-environment 103. When the door arm 115b stops at a prescribed swing angle, the door elevator mechanism 115d starts to operate, whereby the door 115a is moved downward with the door opening and closing actuator 115c. By this operation, the first opening 111 is fully opened, and the mini-environment 103 is in communication with the interior of the pod body 2 via the first opening 111. In this state, the robot 109 starts to operate, and transfers wafers 4 from the interior of the pod 1 to the wafer processing apparatus 117 through the second opening 113, using the robot arm 109a. Furthermore, while this state is maintained, the robot 109 also transfers wafers that have undergone a certain processing in the interior of the wafer processing apparatus 117 into the interior of the pod 1. By reversing the above procedure basically, the lid 3 is attached to the pod, and the pod 1 can be detached from the lid opening and closing system 101.

By using the above described pod and the FIMS system in the form of a lid opening and closing system suitable for the pod, influences of very small dust particles adhering on the surface of the lid that closes the pod opening can be reduced, and generation of dust upon operation of opening and closing the lid and diffusion of dust thus generated into the mini-environment and the pod can also be reduced. More specifically, fixation of the lid 3 to the pod body 2 and releasing of the fixation are performed from the outer lateral sides of the flange portion 2c provided on the pod body. For example, air flow directed from the vicinity of the outer periphery of the first opening 111 to the exterior space may be generated, which can further reduce the possibility of diffusion of small dust particles or the like into the pod or the mini-environment, which has already been reduced by their arrangement.

The above description of the embodiment has been directed mainly to an FIMS system for wafers. However, the applications of the invention are not limited to that system, but the present invention can also be applied to closed containers for storing display panels, optical disks or the like.

What is claimed is:
1. A closed container comprising:
   a lid having a flat plate shape and having a plurality of engaged portions, respectively, disposed in said flat plate shape;
   a container body including
      an interior space in which an object can be stored,
      an opening in a surface of the container body, the opening allowing communication between said interior space and an external space, and the opening being closed by one side of said flat plate shape of said lid,
      a flange portion that extends from a periphery of said opening parallel to the surface in which the opening is formed and that defines a receiving recess in which said lid is received in a state in which said opening is closed by said lid, and
      a plurality of insertion holes, corresponding to the plurality of engaged portions, respectively, passing from an outer surface of said flange portion to said receiving recess, each of the plurality of insertion holes being located at a position through said flange portion that is aligned with the corresponding engaged portion in a state in which said lid is received in said receiving recess; and
   at least one latch mechanism including
      a latch main body mounted on the container body and movable along an axis parallel to said surface through which the opening is formed and that extends in a direction of said axis,
      a plurality of link portions, corresponding to the plurality of insertion holes, respectively, disposed at the outer surface of said flange portion, the plurality of link portions projecting from said latch main body in a direction different from the direction along said axis, and
      a plurality of engagement portions, each being disposed at an end of one of the plurality of link portions, respectively,
   wherein each of the plurality of engagement portions reaches said receiving recess through the corresponding insertion hole,
   wherein each of the plurality of engagement portions engages each of the corresponding engaged portions of said lid disposed in said receiving recess, and
   wherein an engagement of each of the plurality of engagement portions and each of the corresponding engaged portions and release of the engagement are achieved by movement of said latch main body along said axis.

2. The closed container according to claim 1, wherein each of the plurality of engaged portions has an L-shape, including
   a first straight portion that extends along a direction in which an outer peripheral surface of said flat plate shape extends, and
   a second straight portion that extends along a thickness direction of said lid and has an open end on one side of said flat plate shape,
   wherein said corresponding engagement portion is capable of engaging an inner wall that defines said first straight portion of the L-shape, and
   wherein the engagement is released when said corresponding engagement portion is moved into said second straight portion by movement of said latch main body along said axis.

3. The closed container according to claim 2, wherein said first straight portion and said second straight portion in said each of the plurality of engaged portions includes a recess that opens on an outer peripheral surface of said flat plate shape.

4. The closed container according to claim 2, wherein said each of the plurality of engagement portions includes a disk roller that rolls while in contact with said inner wall.

5. The closed container according to claim 1, wherein said at least one latch mechanism further includes a plurality of biasing means for exerting, respectively, to the corresponding engagement portion, a biasing force that retains said corresponding engagement portion stationary at a position at which said corresponding engagement portion engages said corresponding engaged portion.

6. The closed container according to claim 1, wherein said latch main body further includes a slide rail that supports said latch main body such that the latch main body is movable along said axis, said slide rail being disposed on a surface of said flange portion in a container body side of the flange portion.

7. A lid opening and closing system that opens and closes said lid of said closed container according to claim 1 to allow said object to be moved into or out of the interior space of said closed container, comprising:
   a mini-environment having an opening portion;
   a door that moves between a position at which said opening portion is substantially closed and a position at which said opening portion is open; and latch mechanism drive means that operates said at least one latch mechanism when said closed container is at a position at which opening and closing of said lid by said door is performed, said latch mechanism drive means being disposed in a vicinity of said opening portion.

8. The lid opening and closing system according to claim 7, wherein said latch mechanism drive means includes at least one rod that is disposed coaxially with said axis, and that pushes said latch main body of the at least one latch mechanism along said axis, and
wherein said at least one rod is supported by at least one actuator in such a way that said at least one actuator extends and retracts said at least one rod along said axis.

9. The lid opening and closing system according to claim 7, further comprising a flange cover that covers an outer peripheral surface of said flange portion when said closed container is at a position at which said lid is opened and closed.

10. The closed container according to claim 1, wherein said each of the plurality of link portions projects from said latch main body in a direction perpendicular to said axis.

11. A closed container comprising:
a lid having a plate shape formed by a front surface, and a rear surface opposed to the front surface, and having a plurality of engaged portions, respectively, disposed on an outer periphery of the lid connecting the front surface and the rear surface;
a container body, including
an interior space in which an object can be stored,
an opening in a surface of the container body, the opening allowing communication between the interior space and an external space, and the opening being closed by the lid,
a receiving recess which is a part of the interior space and is located adjacent to the opening, and which receives the lid to close the opening, and
a plurality of insertion holes, corresponding to the plurality of engaged portions, respectively, passing from an outer surface of the container body to the receiving recess, each of the plurality of insertion holes being located at a corresponding position aligned with the corresponding engaged portion in a state in which the lid is received in the receiving recess; and
at least one latch mechanism that is movable along a moving direction parallel to said surface through which the opening is formed, the at least one latch mechanism including:
a latch main body disposed on the outer surface of the container body, and
a plurality of engagement portions, corresponding to the plurality of engaged portions, respectively, each of the plurality of engagement portions being projected in a direction different from the moving direction,
wherein each of the plurality of engagement portions reaches the receiving recess through the corresponding insertion hole,
wherein, in an engaged state, each of the plurality of engagement portions engages with each of the corresponding engaged portions located within the receiving recess, and
wherein each of the plurality of engagement portions and each of the corresponding engaged portions are engaged and released by moving the at least one latch mechanism along the moving direction.

12. The closed container according to claim 11, wherein the each of the plurality of engaged portions includes a concave portion disposed on the outer periphery of the lid.

13. The closed container according to claim 11, wherein each of the plurality of engaged portions is formed by a continuous groove shape having an open end which opens to the rear surface of the lid, and an extending part extending in a direction parallel with the moving direction.

14. The closed container according to claim 11, wherein when the lid is detached from the container body, each of the plurality of engagement portions projects into the receiving recess.

15. The closed container according to claim 11, wherein the at least one latch mechanism includes a plurality of link portions, each of which connects the latch main body with the corresponding engagement portion and projects along a direction different from the moving direction.

16. A lid opening and closing system that opens and closes the lid of the closed container according to claim 11 to allow the object to be moved into or out of the interior space of the closed container, comprising:
a mini-environment having an opening portion;
a door that moves between a position at which the door substantially closes the opening portion and a position at which the opening portion is open; and
latch mechanism drive means that operates the at least one latch mechanism to move the latch main body of the at least one latch mechanism when the closed container is at a position at which opening and closing of the lid by the door is performed, the latch mechanism drive means being disposed in a vicinity of the opening portion independently from the closed container.

17. The lid opening and closing system according to claim 16, further comprising:
a housing that defines the mini-environment,
wherein the latch mechanism drive means is located outside the housing.

* * * * *